(12) United States Patent
Sugawara

(10) Patent No.: US 6,868,176 B2
(45) Date of Patent: Mar. 15, 2005

(54) IMAGE PROCESSING METHOD AND DEVICE

(75) Inventor: Kenji Sugawara, Kokubunji (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 593 days.

(21) Appl. No.: 10/044,498

(22) Filed: Jan. 10, 2002

(65) Prior Publication Data

US 2002/0122584 A1 Sep. 5, 2002

(30) Foreign Application Priority Data

Jan. 11, 2001 (JP) .................................. 2001-003153

(51) Int. Cl.⁷ .................................................. G06K 9/00
(52) U.S. Cl. .......................... 382/151; 382/143; 382/145
(58) Field of Search .......................... 382/141, 143–152, 382/181, 184; 348/86, 87, 126; 356/237.1, 237.4, 237.5; 438/16; 716/5

(56) References Cited

U.S. PATENT DOCUMENTS 4,737,920 A * 4/1988 Ozawa ............................ 716/5
5,850,466 A * 12/1998 Schott ........................ 382/141

FOREIGN PATENT DOCUMENTS

JP H9-102039 4/1997

* cited by examiner

Primary Examiner—Vikkram Bali
(74) Attorney, Agent, or Firm—Koda & Androlia

(57) ABSTRACT

In image processing method and device used in, for instance, wire bonding, the amount of positional deviation, which is of between a reference image and a rotated image which is obtained by rotating the reference image by a particular angle, is calculated by pattern matching between such two images, and then a first alignment point is determined based upon the calculated amount of the positional deviation and the rotational angle which is a known quantity. By way of using the first alignment point as a reference, pattern matching is executed between the reference image and an image of a comparative object (a semiconductor device, for instance) that is obtained by imaging the comparative object disposed in an attitude that includes positional deviations in the rotational direction, thus minimizing the error in the detected position of the comparative object.

9 Claims, 16 Drawing Sheets

32a (Xp1, Yp1)

IMAGE PROCESSING METHOD AND DEVICE

BACKGROUND OF THE INVENTION

1. Field of the Invention

The present invention relates to an image processing method and device, and more particularly to a method and device for calculating the position of a comparative object by executing pattern matching between this comparative object and a reference image.

2. Prior Art

Pattern matching that uses a portion of a reference image constituting a known image as a template image in order to detect the position of a comparative object by detecting the position of this known image contained in an image of the comparative object is widely used in image processing technology.

A position detection method utilizing this pattern matching will be described using a wire bonding apparatus, which is a semiconductor assembly apparatus, as an example. In a wire bonding apparatus, wires consisting of a metal wires, etc., are bonded so that these wires connect bonding pads consisting of aluminum, etc., on the surface of a semiconductor chip and leads consisting of conductors formed so that these leads surround the semiconductor chip. Prior to this bonding operation, the bonding points which are the points where bonding is performed are calculated using pattern matching.

First, as shown in FIG. 18, alignment points which constitute reference points used for positional alignment are registered. In a wire bonding apparatus which has a structure that is as similar as in FIG. 1 in which a camera 7 that is fastened to an XY table 1 is moved in the horizontal direction relative to a semiconductor chip 14a by the operation of this XY table 1, such a registration is accomplished in the following manner: while an image from the camera 7 which has imaged the semiconductor chip 14 is displayed on the display screen of a monitor 39, the visual field is moved by moving the XY table 1 to which the camera 7 is fastened, so that the center point 32a of cross marks 32 that indicate the center of the visual field displayed on the display screen of the monitor 39 is aligned with an arbitrary point on the semiconductor chip 14a, and an input operation is performed by pressing an input switch, etc., of a manual input means 33. An image of the region surrounded by a rectangular reticle mark 42 centered on the center point 32a in this case is stored in memory as a template image, and the coordinates on the XY table 1 in this case are stored in a data memory 36 as an alignment point.

In regard to these alignment points, two locations (Pa1x, Pa1y) and (Pa2x, Pa2y) are generally selected for the pad side, and two locations (La1x, La1y) and (La2x, La2y) are generally selected for the lead side, from diagonal lines in the vicinity of the four corners of the semiconductor chip 14a in order to minimize the detection error.

Next, the coordinates of the respective bonding points are stored in the data memory 36 by pressing the input switch, etc., while aligning the center point 32a of the cross marks 32 with appropriate positions on the individual pads P and leads L, generally the approximate centers of the pads P, and points that are located at the approximate centers of the leads L with respect to the direction of width and at a fixed distance from the end of each lead L.

Then, as run time processing (i.e., processing at the time of production of the product), a new semiconductor device 14 is installed as a comparative object, the XY table 1 is moved by the control of the control section 34 so that the vicinity of the registered alignment point A0 constitutes the visual field of the camera 7 (FIG. 19), and an image of the semiconductor device 14 is acquired by the camera 7. Further, by pattern matching detection using a registered reference image, the reference image is superimposed on the image of the comparative object in relative positions which are such that the amount of coincidence between the image of the comparative object and the reference image shows a maximum value, and the amount of positional deviation ($\Delta X$, $\Delta Y$) between the positional coordinates of the center point 32a in this attitude on the XY table 1 and the positional coordinates of the alignment point A0 on the XY table 1 (constituting the position of the center point 32a at the time that the template image is previously registered), e.g., (Pa1x, Pa1y) is determined.

The positional deviation is likewise calculated for all of the alignment points.

Then, the calculated amounts of positional deviation ($\Delta X$, $\Delta Y$) are added to the positional coordinates of the alignment points determined at the time that the template image is previously registered, e.g., as (Pa1x+$\Delta X$, Pa1y+$\Delta Y$), and the values thus obtained are taken as new alignment points Am.

Next, the actual bonding points are determined by calculating the positions of the respective pads and leads (this will be referred to below as "position correction") from the positions of the new alignment points Am in such a manner that the relative positions of the respective pads and leads with respect to the alignment points A0 at the time of registration are preserved. Then, a bonding operation is next performed on these actual bonding points.

In cases where the semiconductor device 14, which is a comparative object, is disposed in an attitude that includes positional deviation in the rotational direction thereof, problems occur. Even if pattern matching detection using a registered reference image is performed, high-precision correction of the positions of the pads P and leads L cannot be accomplished.

The reason for the problems is as follows: in principle, if the image of the comparative object and the reference image are superimposed so that the amount of coincidence shows a maximum value for the pattern serving as a reference (the pads P in FIG. 19), the position of the new alignment point Am stipulated by the relative position with respect to the pattern serving as a reference should coincide with the position of the original alignment point A0 likewise stipulated by the relative position with the pads P in the reference image. However, as shown in FIG. 20, in a case where the semiconductor device 14, the comparative object, is disposed in an attitude that includes positional deviation thereof in the rotational direction, the original alignment point A0 and the new alignment point Am do not coincide even if the image of the comparative object and the reference image are superimposed so that the amount of coincidence shows a maximum value for the pattern serving as a reference (the pads P in FIG. 20).

On the other hand, it is sufficient if a point that tends not to be affected by the rotation of the attitude of the semiconductor device 14 constituting the comparative object is set as the alignment point. However, it is difficult for the operator to find such an alignment point. The error caused by this positional deviation of the comparative object in the rotational direction is not a problem if the pitch between the pads P or pitch between the leads L is sufficiently large. This error, however, has become a major problem in handling the reduction in pitch seen in recent years, i.e., the reduction in the pitch between the pads P and between the leads L.

Meanwhile, various methods have also been proposed in which pattern matching with the image of a comparative object is executed while the reference image is rotated (e.g., see Japanese Patent Application Laid-Open (Kokai) No. H09-102039). In the case of such methods, position detection that takes into account positional deviation in the rotational direction of a semiconductor device is possible. However, pattern matching in several increments in the rotational direction of the semiconductor device must be executed for numerous points in the visual field, so that the amount of calculation required is extremely large, thus slowing the recognition speed so that such methods are not practical.

SUMMARY OF THE INVENTION

Accordingly, the object of the present invention is to provide an image processing method and device which makes it possible to realize high-precision position detection without performing pattern matching in the rotational direction (which tends to require an extremely large amount of calculation), even in cases where a comparative object is disposed in an attitude that includes positional deviation in the rotational direction of the comparative object which is, for instance, a semiconductor device.

The above object is accomplished by a unique process for an image processing method of the present invention that comprises the steps of:

executing pattern matching between a rotated image and a reference image, the rotated image being obtained by rotating the reference image that is inputted beforehand;

specifying, based upon a result of the pattern matching, a rotation-resistant reference point at which an error of position of a comparative object becomes a minimum value, the error being detected by pattern matching between an image of the comparative object, which is obtained by imaging the comparative object disposed in an attitude that includes a positional deviation in a direction of rotation of the comparative object, and the reference image; and performing a positional alignment of the image of the comparative object and the reference image using the rotation-resistant reference point as a reference, thus calculating a position of the comparative object.

In the above method, pattern matching is executed between a rotated image, which is obtained by rotating a reference image that is inputted beforehand, and the reference image. Next, a rotation-resistant reference point which is such that an error of the position of a comparative object disposed in an attitude including a positional deviation in the direction of rotation of the reference image (the error being detected by pattern matching between an image of the comparative object obtained by imaging the comparative object and the reference image) shows a minimum value is specified based upon the results of this pattern matching. Then, the positions of the image of the comparative object and the reference image are aligned using the rotation-resistant reference point as a reference, and the position of the comparative object is calculated.

Thus, in the above method, since the rotation-resistant reference point is determined by executing pattern matching between the rotated image and the reference image beforehand, the detection error in the position of the comparative object can be reduced when the positions of the image of the comparative object and the reference image are aligned using this rotation-resistant reference point as a reference. As a result, even in cases where the comparative object is disposed in an attitude that includes positional deviation in the rotational direction, high-precision position detection can be performed without executing pattern matching in the rotational direction, which tends to require an extremely large amount of calculation.

The above object is accomplished by another unique process for an image processing method of the present invention that comprises the steps of:

calculating an amount of positional deviation between a rotated image and a reference image based upon pattern matching between the rotated image and the reference image, the rotated image being obtained by rotating the reference image that is inputted beforehand;

specifying, based upon an angle of the rotation and the amount of positional deviation, a rotation-resistant reference point at which an error of position of a comparative object becomes a minimum value, the error being detected by pattern matching between an image of the comparative object, which is obtained by imaging the comparative object disposed in an attitude that includes a positional deviation in a direction of rotation of the comparative object, and the reference image; and performing a positional alignment of the image of the comparative object and the reference image using the rotation-resistant reference point as a reference, thus calculating a position of the comparative object.

In the above method of the present invention, the amount of positional deviation between a rotated image, which is obtained by rotating a reference image, and this reference image is calculated based upon pattern matching between such two images, and a rotation-resistant reference point is specified based upon the angle of the above-described rotation and the above-described amount of positional deviation. In other words, a rotation-resistant reference point can be specified using the amount of positional deviation obtained by pattern matching between the rotated image and the reference image, and the angle of rotation which is a known quantity.

The above object is accomplished by still another unique process for an image processing method of the present invention that comprises the steps of:

performing calculations of amount of coincidence between a rotated image and a reference image for each of a plurality of different centers of rotation within the reference image, the rotated image being obtained by rotating the reference image that is inputted beforehand;

specifying a center of rotation or a point in a region near the center of rotation as a rotation-resistant reference point, the center of rotation being within a specified range from a maximum value of the amount of coincidence among the plurality of different centers of rotation, and the rotation-resistant reference point being at which an error of position of a comparative object becomes a minimum value, the error being detected by pattern matching between an image of the comparative object, which is obtained by imaging the comparative object disposed in an attitude that includes a positional deviation in a direction of rotation of the comparative object, and the reference image; and performing a positional alignment of the image of the comparative object and the reference image using the rotation-resistant reference point as a reference, thus calculating a position of the comparative object.

In the above method of the present invention, the amount of coincidence between a rotated image, which is obtained by rotating a reference image, and this reference image is respectively calculated for a plurality of different centers of rotation within the reference image, and a center of rotation (among the above-described plurality of different centers of rotation) at which the amount of coincidence is within a specified range from the maximum value, or a point in a region near this center of rotation, is specified as a rotation-resistant reference point. Accordingly, the influence of the positional deviation of the attitude of the comparative object in the rotational direction can be reduced.

In any of the above methods, at least two of the rotation-resistant reference points are specified for a single comparative object; and two of the rotation-resistant reference points are included in a single image frame upon performing the positional alignment.

Thus, at least two of the rotation-resistant reference points are specified for a single comparative object, and the at least two rotation-resistant reference points are included in a single image frame in the positional alignment of the comparative object and the reference image. Accordingly, in addition to the effects and advantages of the present invention as described above, image acquisition at the time of positional alignment needs to be performed only once, and the working efficiency of the position detection process can be improved.

Furthermore, the image processing method of the present invention may includes a step of calculating working processing points in the comparative object using the rotation-resistant reference points as a reference.

In this method, the working processing points in the comparative object are calculated using the rotation-resistant reference points as a reference. Accordingly, as a result of the positions of the rotation-resistant reference points being determined with a high precision, the precision with which the positions of working processing points are detected can be increased also.

Furthermore, in the above method that includes the step of calculating working processing points: two of the rotation-resistant reference points are specified for a single comparative object; and working processing points that are present outside a circle, which contacts the two rotation-resistant reference points and whose diameter is a straight line that connects the two rotation-resistant reference points, are calculated.

In this method, the working processing points that are located outside a region that is surround by two rotation-resistant reference points are calculated for a single comparative object. Accordingly, compared to the conventional method in which the working processing points that are present inside a region surrounded by two alignment points are calculated, the distance of the relative movement of the camera and the comparative object during the imaging of the two rotation-resistant reference points can be further reduced. In addition, by way of allowing two rotation-resistant reference points to be included in a single image frame, the distance of the relative movement of the camera and the comparative object during the imaging of the two rotation-resistant reference points can be reduced to zero. Accordingly, the working efficiency of the position detection process can be further improved.

The above object is also accomplished by a unique structure for an image processing device of the present invention that comprises:

a trial processing means that executes pattern matching between a rotated image and a reference image, the rotated image being obtained by rotating the reference image that is inputted beforehand;

a reference point calculating means that specifies, based upon a result of the pattern matching, a rotation-resistant reference point at which an error of position of a comparative object becomes a minimum value, the error being detected by pattern matching between an image of the comparative object, which is obtained by imaging the comparative object disposed in an attitude that includes a positional deviation in a direction of rotation of the comparative object, and the reference image; and a position detection means that performs a positional alignment of the image of the comparative object and the reference image using the rotation-resistant reference point as a reference, thus calculating a position of the comparative object.

The above image processing device provides a substantially the same effect and advantages described with reference to the image processing method of the present invention.

DETAILED DESCRIPTION OF THE INVENTION

First Embodiment

Figure 1:
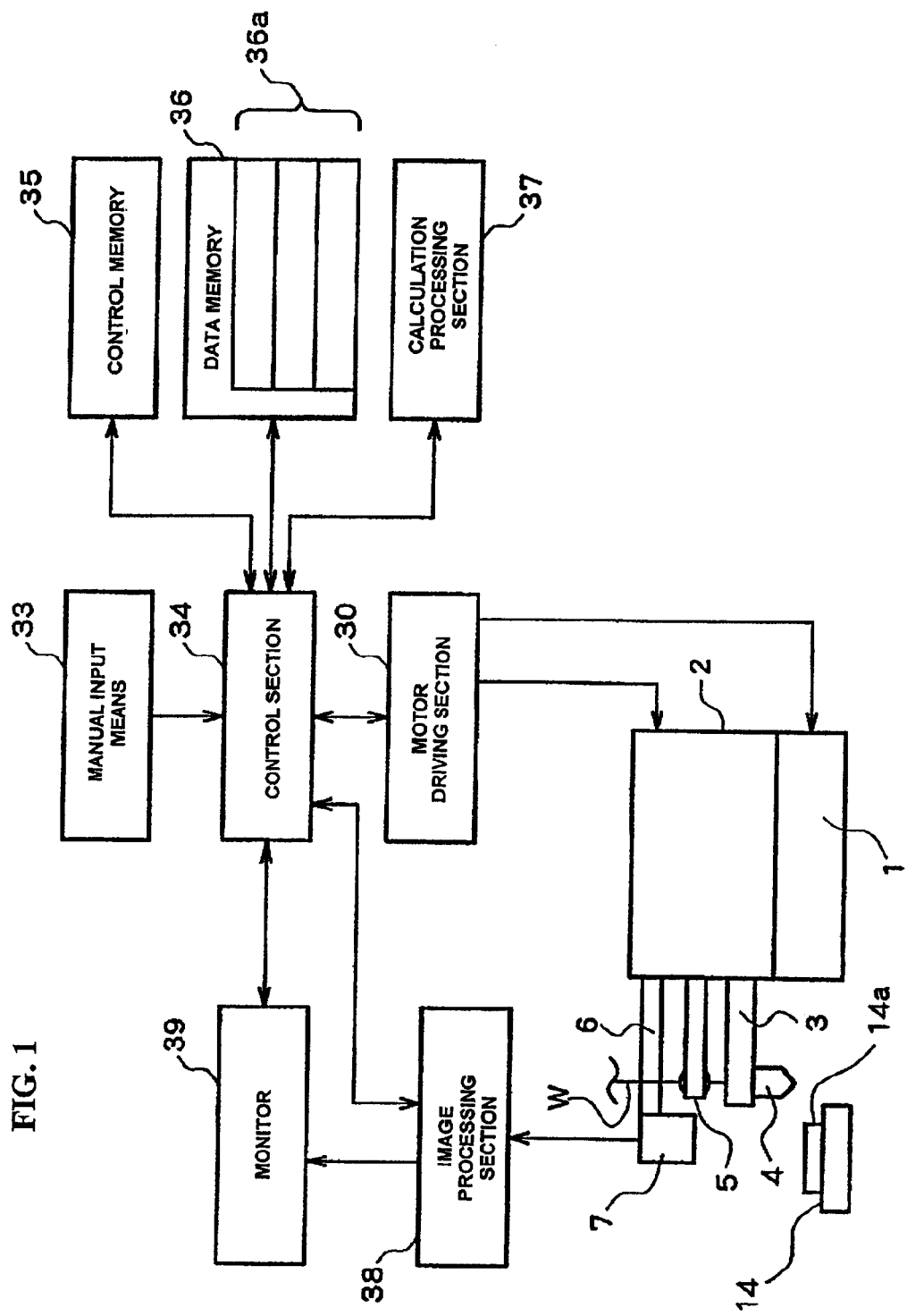
FIG. 1 is a block diagram of a bonding apparatus in which the image processing method and device of the present invention is used.

FIG. 1 shows a schematic structure of a wire bonder structured according to one embodiment of the present invention.

In FIG. 1, a bonding arm 3 is disposed on a bonding head 2 which is mounted on an XY table 1, and a tool 4 is attached to the tip end of the bonding arm 3. The bonding arm 3 is driven in the vertical direction by a Z-axis motor (not shown). A damper 5 which holds a wire W is disposed above the bonding arm 3. The lower end of the wire W is passed through the tool 4. The tool 4 in this embodiment is a capillary.

A camera arm 6 is fastened to the bonding head 2, and a camera 7 is fastened to the camera arm 6. The camera 7 images a semiconductor device 14 on which a semiconductor chip 14a, etc., is mounted. The XY table 1 is structured so as to be accurately moved in the X and Y directions, which are the directions of the mutually perpendicular coordinate axes in the horizontal plane, by means of XY table motors (not shown). The XY table motors are, for instance, two pulse motors that are installed in the vicinity of the XY table 1. The structure described so far is a known in the prior art.

The XY table 1 is driven via a motor driving section 30 and the XY table motors by commands from a control section 34 which is, for instance, a microprocessor. The image acquired by the camera 7 is converted to image data that is an electrical signal; and this image data is processed by an image processing section 38 and inputted into a calculation processing section 37 via the control section 34. In the calculation processing section 37, various types of calculations including calculations involved in position detection (described later) are performed, and programs and data used for such calculations are temporarily held in a control memory 35. A manual input means 33 and a monitor 39 are connected to the control section 34. The manual input means 33 preferably is at least a pointing device such as a mouse input device equipped with a direction indicating function for the X and Y directions and a set signal input function using an input button. Keyboards equipped with a character input function can be also used as the manual input means 33.

Figure 4:
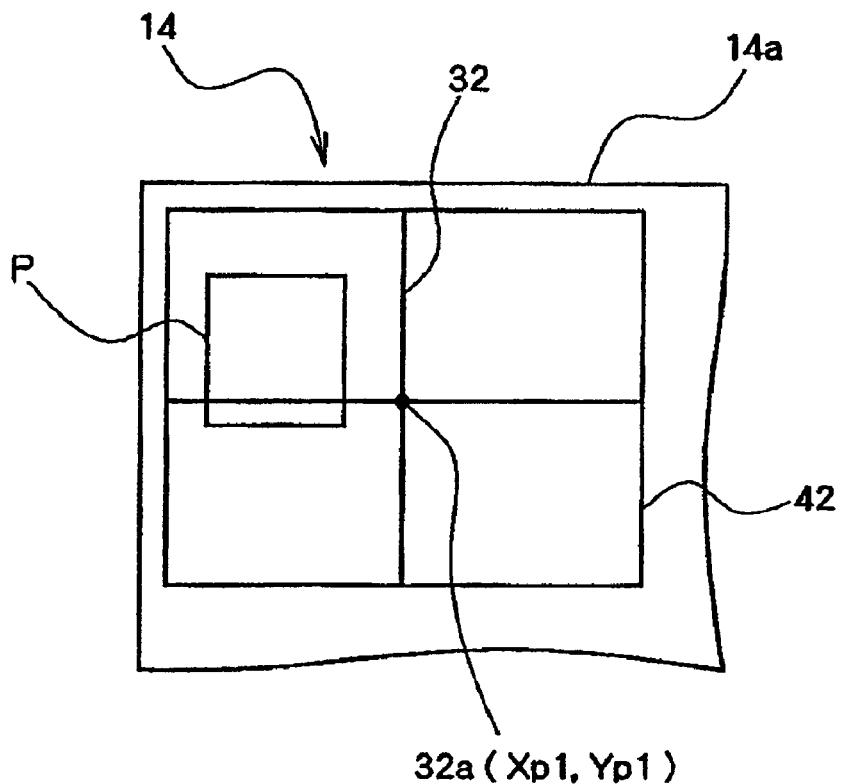
FIG. 4 is an explanatory diagram that illustrates the reference image in the first embodiment of the present invention.
Figure 5:
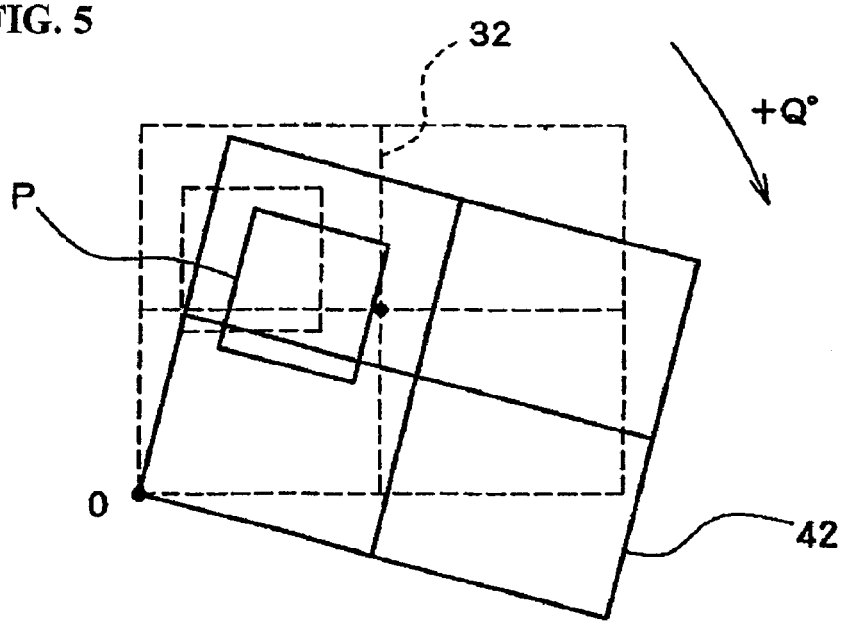
FIG. 5 is an explanatory diagram that illustrates the rotated image (forward direction) in the first embodiment of the present invention.

The monitor 39 is a CRT (cathode ray tube), liquid crystal display device, etc. Images acquired by the camera 7, associated numerical values such as coordinate values and magnifications, etc., and various types of character messages (described later), etc., are displayed on the display screen of the monitor 39 based upon the output of the control section 34. In the position detection process as shown in FIG. 4, cross marks 32 which indicate the center of the visual field, and a rectangular reticle mark 42 which is displayed and stored in memory as a mark that indicates a region within the visual field that surrounds the cross marks 32, are displayed on the display screen. The intersection point of the vertical line and horizontal line in the cross marks 32 is the center point 32a.

The data memory 36 is a known memory, hard disk drive, etc. that allows the reading and writing of data. A data library 36a is accommodated in the storage region of the data memory 36. Template images (described later), past values such as correlation values, etc., default values which are the initial states of these values, and various types of setting values used in other operations of the present device, are stored in this data library 36a. Various types of setting values are stored (as will be described later) by signals from the control section 34.

In the first embodiment, the registration of alignment points and the registration of the respective bonding points are first performed as registration processing for a new semiconductor device 14. Then, position detection that uses pattern matching is performed as processing in the run time.

Figure 2:
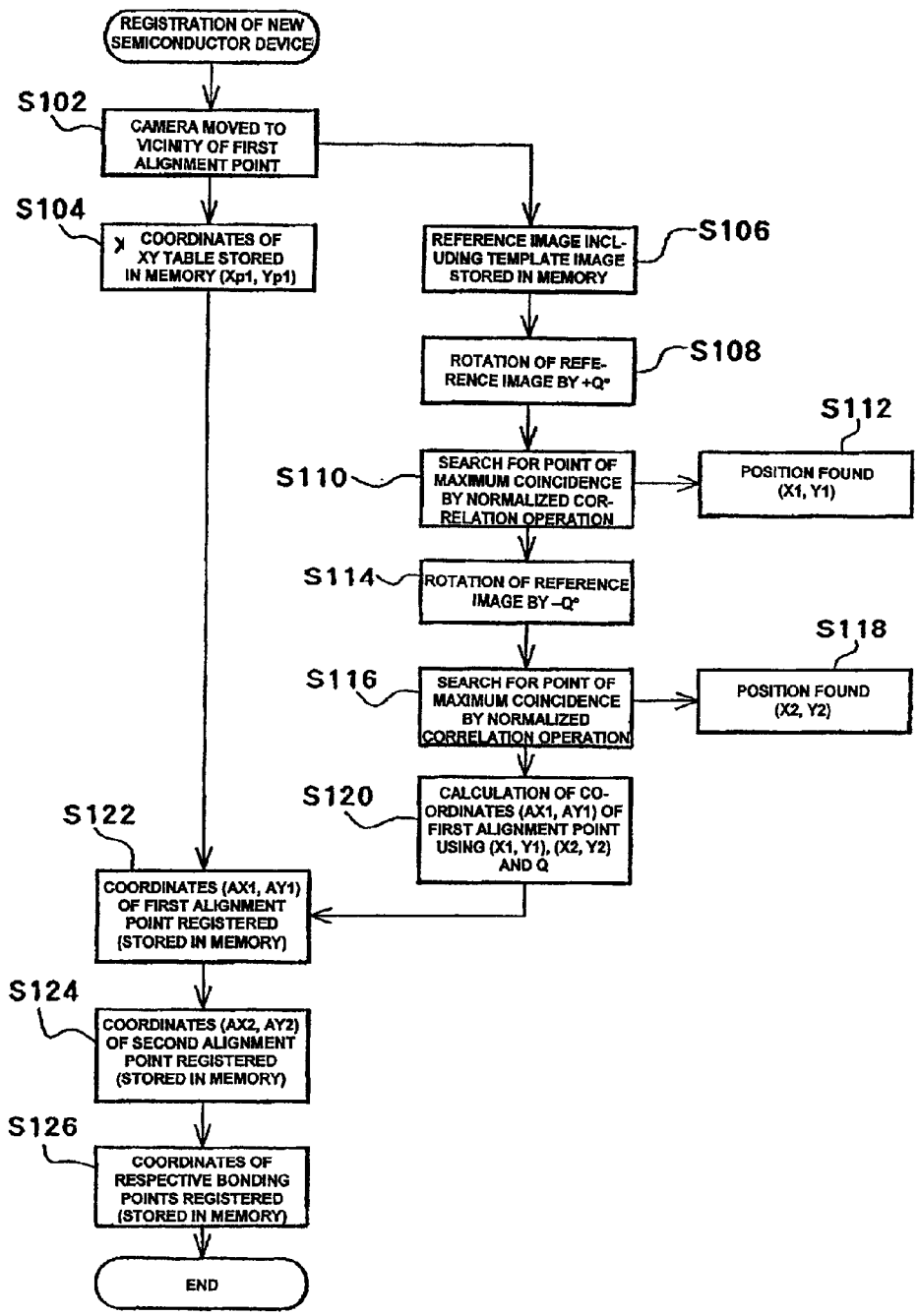
FIG. 2 is a flow chart of one example of the registration processing of a new semiconductor device in the first embodiment of the present invention.

FIG. 2 is a flow chart that illustrates the registration processing for a new semiconductor device 14.

First, the XY table 1 is driven by the output of the control section 34, and the camera 7 is moved to the vicinity of a point that is to be the first alignment point (S102). Then, as shown in FIG. 4, the position of the center point 32a of the cross marks 32 in the moved attitude is stored in the data memory 36 by the output of the control section 34 as the coordinates (Xp1, Yp1) of the reference imaging point (S104). Furthermore, a semiconductor device 14 is imaged by the camera 7 in this position. The image data of the semiconductor device 14 that is converted into an electrical signal is processed by the image processing section 38 and stored in the data library 36a of the data memory 36 as a reference image (S106). Within the reference image, the region surrounded by the reticle mark 42 is used as a template image in the position detection process (described later). The image in an upright attitude indicated by the solid lines in FIG. 4 and by dotted lines in FIGS. 5 through 8 corresponds to the reference image. The reference imaging point (Xp1, Yp1) which is the position of the center point 32a corresponds to the alignment point prior to improvement by the present invention.

Next, in the calculation processing section 37, processing which rotates the reference image by +Q° (degrees) is performed (S108). This rotation is performed, for instance, about a point O located at the lower left corner of the reticle mark 42 in FIG. 5. The image obtained as a result of such rotation processing will be referred to below as a "rotated image". The image with an inclined attitude drawn by solid lines in FIGS. 5 and 6 and in FIGS. 7 and 8 (described later) is the rotated image.

Next, a pattern matching processing between the rotated image and reference image is executed. In other words, a search is made, using a normalized correlation operation (S110), for the point of maximum coincidence with the reference image in the rotated image. More specifically, correlation values R between the rotated image and the reference image calculated by the following Numerical Expression 1 are calculated for the respective pixels within the region of the rotated image or for respective reference points disposed in a scattered manner within the region of the rotated image; then, a search is made for a point where the correlation value R shows a maximum value, and this point is taken as the above-described point of maximum coincidence.

$$R = \frac{\{N\Sigma IM - \{\Sigma I \Sigma M\}\}}{\sqrt{\{N\Sigma I^2 - \{\Sigma I\}^2\}\{N\Sigma M^2 - \{\Sigma M\}^2\}}}$$ Numerical Expression 1

Range of $R$: $-1 \leq R \leq 1$

Here, R is the correlation value, N is the number of pixels in the rotated image, I is the brightness value at respective positions within the rotated image, and M is the brightness value of the rotated image.

Figure 6:
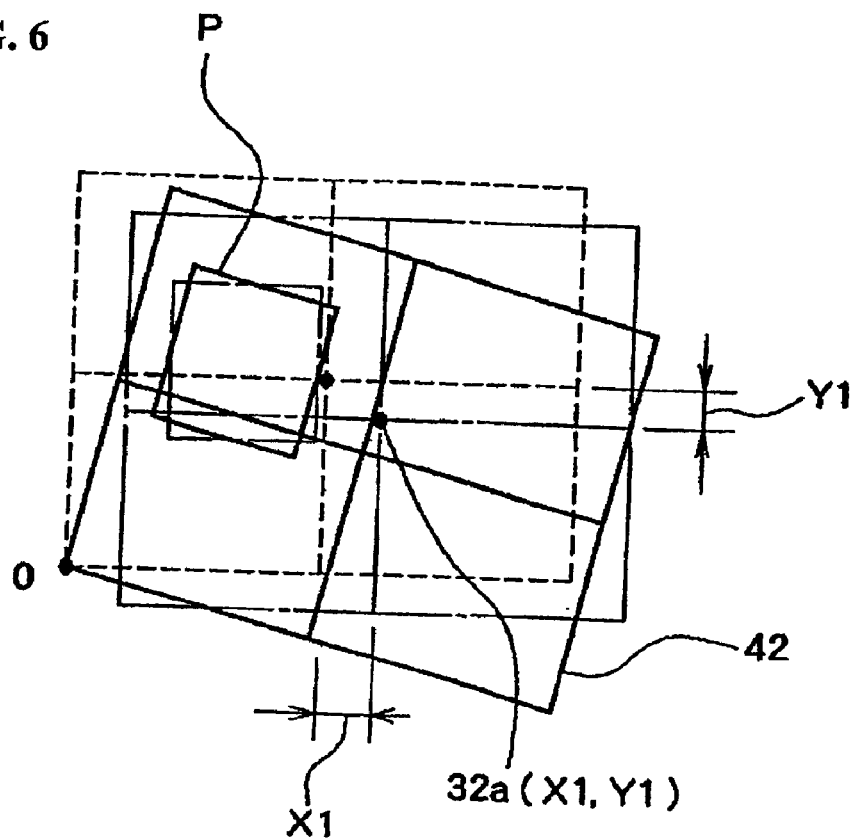
FIG. 6 is an explanatory diagram that illustrates the process of pattern matching for the rotated image (forward direction) in the first embodiment of the present invention.

The coordinates (X1, Y1) of the point of maximum coincidence thus determined are stored in the data memory 36 (S112, FIG. 6).

Figure 7:
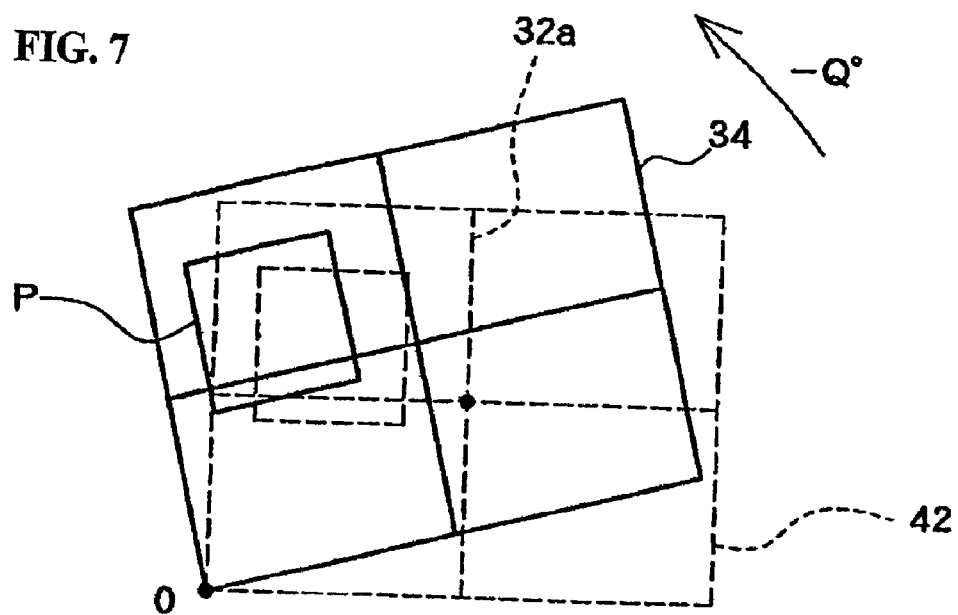
FIG. 7 is an explanatory diagram that illustrates the rotated image (reverse direction) in the first embodiment of the present invention.

Next, in the calculation processing section 37, processing is performed in which the reference image is rotated by $-Q°$ (degrees) (S114, FIG. 7). As in the case of step S108, this rotation is performed about the point O located at the lower left corner of the reticle mark 42.

Then, as a pattern matching processing between the rotated image and reference image, with the use of the normalized correlation operation of the Numerical Expression 1, a search is made for the point of maximum coincidence with the reference image in the rotated image (S116). In concrete terms, correlation values R between the rotated image and the reference image calculated by the Numerical Expression 1 are calculated for the respective pixels within the region of the rotated image or for respective reference points disposed in a scattered manner within the region of the rotated image; then, a search is made for a point where the correlation value R shows a maximum value, and this point is taken as the above-described point of maximum coincidence.

Figure 8:
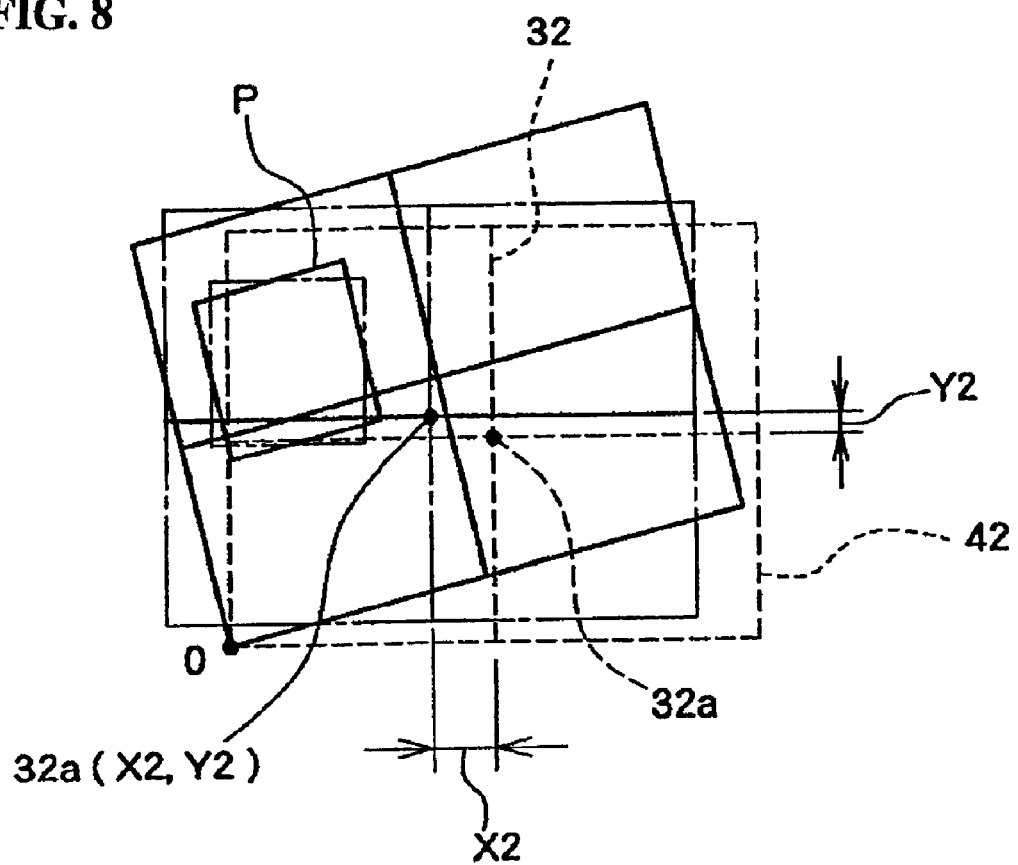
FIG. 8 is an explanatory diagram that illustrates the process of pattern matching for the rotated image (reverse direction) in the first embodiment of the present invention.

The coordinates (X2, Y2) of the point of maximum coincidence thus determined are stored in the data memory 36 (S118, FIG. 8).

Furthermore, the first alignment point that is used as a rotation-resistant reference point in the present invention is determined. This is done using the coordinates (X1, Y1) and (X2, Y2) of the points of maximum coincidence thus determined and Q (degrees) which is a known rotational angle (S120). The calculation for determining the first alignment is performed in approximate terms using the Numerical Expressions 2 and 3 shown below. The first alignment point can be calculated based upon a polar coordinate system expressed using the radius r and angle $\alpha$, with the point O used as a reference.

$\alpha = \tan^{-1}\{(X2-X1)/(Y1-Y2)\}$  Numerical Expression 2

$r = \sqrt{\{(X2-X1)^2+(Y2-Y1)^2\}}/2 \sin Q$  Numerical Expression 3

Figure 9:
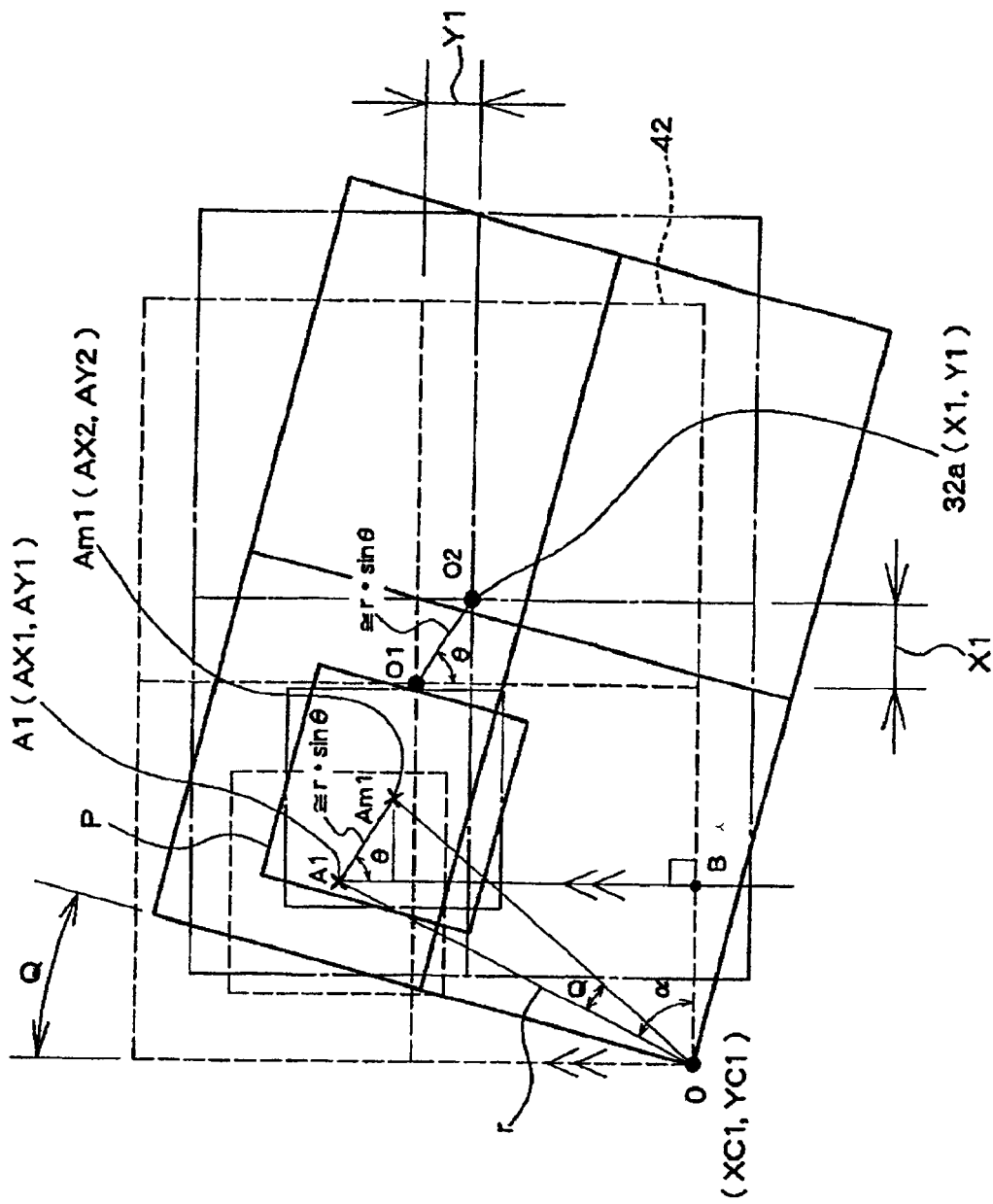
FIG. 9 is an explanatory diagram that illustrates the alignment point calculation method in the first embodiment of the present invention.

As seen from FIG. 9, Numerical Expression 2 utilizes the fact that the angle ∠O·A1·Am1 in FIG. 9 can be approximated by the right angles in cases where the angle Q is very small. Assuming that a perpendicular leg dropped to the X axis (which is the bottom side of the reticle mark 42 indicated by a dotted line in FIG. 9) from A1 is point B, and that ∠Am1·A1·B is θ, then, from the above-described approximation, (∠O·A1·B)≈90−θ is obtained. Meanwhile, since ∠A1·B·O is the right angles, the angle $\alpha$ of ∠A1·O·B can be approximated as $\alpha \approx \theta$. On the other hand, the angle θ is determined as $\theta = \tan^{-1}(X1/Y1)$. Accordingly, $\alpha \approx \tan^{-1}(X1/Y1)$ is obtained. Numerical Expression 2 is an equation that converts the formula $\alpha \approx \tan^{-1}(X1/Y1)$ into an equation by way of using the coordinates (X1, Y1) and (X2, Y2) obtained by determining the formula $\alpha \approx \tan^{-1}(X1/Y1)$ for the positive and negative angles +Q and −Q.

In the shown embodiment, the reason that pattern matching is divided into the positive and negative angle +Q and −Q is that if the angle Q is excessively large (e.g., if this angle exceeds 5°), then the precision of pattern matching drops, and erroneous recognition occurs.

Numerical Expression 3 utilizes the fact that the distance between the tip ends of line segments of equal length on either side of the angle Q can be approximated as r·sin Q in cases where the rotational angle Q is extremely small. In other words, since pattern matching using a reference image is executed as geometrically parallel movements, the distance (O1O2) between the detection point (point of maximum coincidence) O2 in pattern matching and the point O1 which is the original position of the image center mark is equal to the distance (A1Am1) between the center point Am1 of the image of the pad in the reference image in the pattern-matched attitude and the center point A1 of the image of the pad P in the reference image in the original attitude. Here, from the above-described approximation, (A1Am1)≈r·sin Q is obtained. Accordingly, r·sin Q≈(O1O2); meanwhile, $r \approx \sqrt{\{(X1)^2+(Y1)^2\}}/\sin Q$ is obtained by substituting $(O1O2)=\{(X1)^2+(Y1)^2\}$ into the right side of this equation, and dividing both sides by sin Q. Numerical Expression 3 is an equation that converts this into an equation using the coordinates (X1, Y1) and (X2, Y2) obtained by determining this for the positive and negative angles +Q and −Q.

If $\alpha$ and r obtained by Numerical Expressions 2 and 3 as described above are converted into an orthogonal coordinate system, and the coordinates of the point O are set as (XC1, YC1), then the coordinates of the first alignment point (AX1, AY1) can be expressed, using the point O as a reference, as (AX1, AY1)=(XC1+r·cos $\alpha$, YC1+r·sin $\alpha$). This first alignment point is a rotation-resistant reference point which is such that the error between the image of the comparative object obtained by imaging the comparative object disposed in an attitude including positional deviation in the rotational direction and the position of the above-described comparative object detected by pattern matching with the reference image shows a minimum value. In cases where the pattern utilized (which is the pad P in this embodiment) is a figure of point symmetry such as a square or circle, the center point of this pattern (which is the center point A1 of the pad P in this embodiment) is the first alignment point.

The thus calculated coordinates (AX1, AY1) of the first alignment point A1 are stored in the data memory 36 (S122).

Next, the same processing as in the above steps S102 through S122 is performed for the second alignment point (S124), and the determined coordinates (AX2, AY2) of the second alignment point A2 are stored in the data memory 36. This second alignment point A2 is not shown in the drawings.

Next, the coordinates of each bonding point are registered (S126). More specifically, for the individual pads P and leads L (other than the pads P selected as the first alignment point A1 and second alignment point A2), the visual field is moved to an appropriate position, typically a point that is located at the approximate center of each pad P or lead L, and the coordinates of each bonding point are stored in the data memory 36 by, for instance, pressing the input switch of the manual input means 33, while aligning the center point 32a of the cross marks 32 with this bonding point. Instead of using such a manual input method, it is also possible to determine the points located at the approximate centers of the respective pads P and leads L by image processing and to store these coordinate values in the data memory 36.

The above processing is performed when a new semiconductor device 14 is registered.

Figure 3:
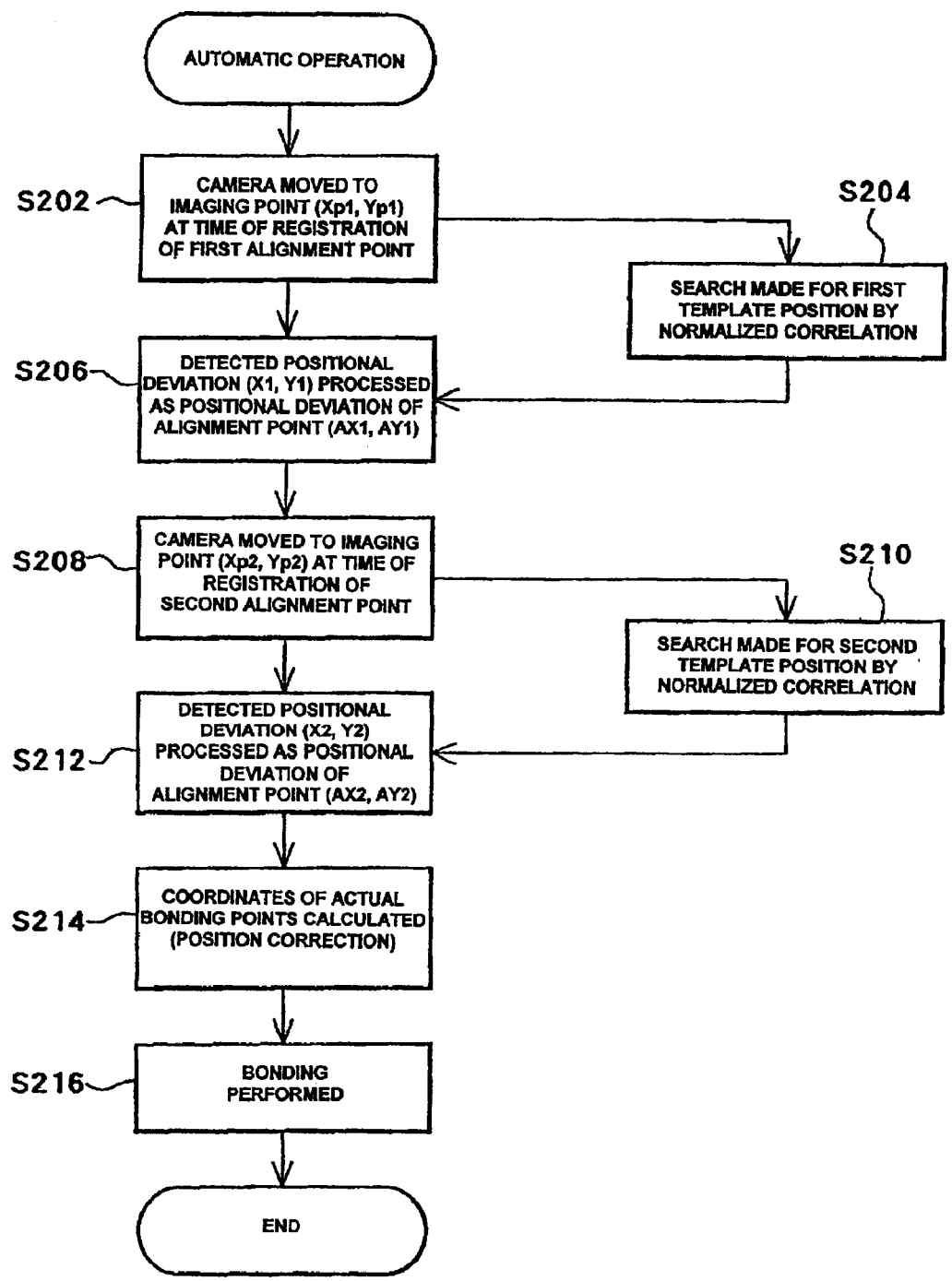
FIG. 3 is a flow chart of one example of the run time processing in the first embodiment of the present invention.
Figure 10:
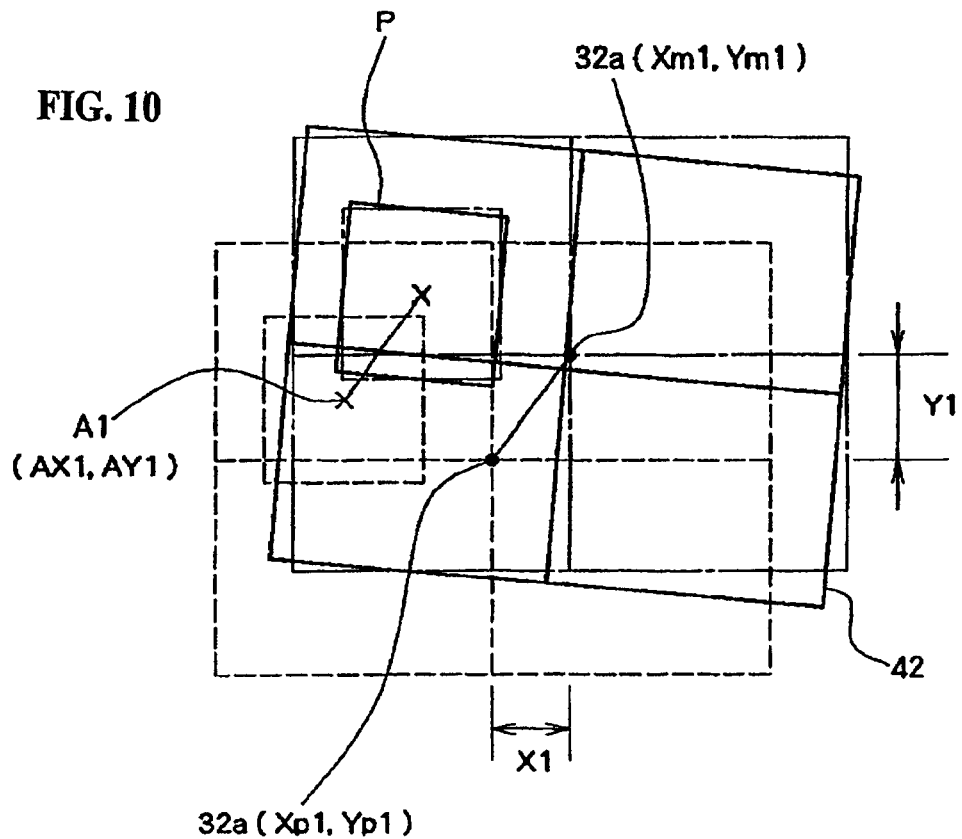
FIG. 10 is an explanatory diagram that illustrates the process of pattern matching between the image of the comparative object and the reference image in the first embodiment of the present invention.

The run time processing is as shown in FIGS. 3 and 10.

First, the new semiconductor device 14 that is the comparative object is set in place. The XY table 1 is operated by the output of the control section 34, thus moving the camera 7 so that the center point of the visual field of the camera 7 coincides with the position (Xp1, Yp1) of the imaging point at the time of registration of the first alignment point (S202). Then, from this position, the semiconductor device 14 that is the comparative object is imaged by the camera 7, so that an image of the comparative object is acquired.

Next, a pattern matching processing between the image of the comparative object and the registered reference image is executed. In other words, a search is made for the point of maximum coincidence with the reference image in the comparative object utilizing a normalized correlation operation (S204). This operation is performed using a normalized correlation equation similar to the Numerical Expression 1; and correlation values R between the image of the comparative object and the reference image are calculated for the respective pixels within the region of the image of the comparative object, or for respective reference points disposed in a scattered manner within the region of the image of the comparative object; then, a search is made for a point where the correlation value R shows a maximum value.

Next, the reference image is superimposed on the image of the comparative object at the point of maximum coincidence thus determined, i.e., in the relative position which is such that the amount of coincidence between the image of the comparative object and the reference image shows a maximum value (FIG. 10), and the amount of positional deviation (X1, Y1) between the coordinates (Xm1, Ym1) of the position of the center point 32a of the cross marks 32 in this attitude and the coordinates (Xp1, Yp1) of the imaging point, which is the position of the center point of the cross marks 32 at the time of the previous registration of the reference image, is determined.

Since the pattern matching is executed as geometrically parallel movements, this amount of positional deviation (X1, Y1) is equal to the amount of positional deviation of the first alignment point A1. Accordingly, the calculated amount of positional deviation (X1, Y1) can be used as the amount of positional deviation of the first alignment point A1. Therefore, the amount of positional deviation (X1, Y1) is stored in the data memory 36 as the amount of positional deviation of the first alignment point A1 in the new semiconductor device 14 with respect to the first alignment point A1 in the semiconductor device 14 at the time of imaging (S206). The coordinates of the position of the first alignment point A1 in the new semiconductor device 14 in this case are (AX1+X1, AY1+Y1).

Next, a processing similar to that performed for the first alignment point A1 in steps S202 through S206 is also performed for the second alignment point A2, and the amount of positional deviation (X2, Y2) thus obtained is stored in the data memory 36 as the amount of positional deviation of the alignment point A2 in the new semiconductor device 14 with respect to the alignment point in the semiconductor chip 14a at the time of imaging (S212). The coordinates of the position of the second alignment point A2 in the new semiconductor device 14 in this case are (AX2+X2, AY2+Y2).

Then, based upon the coordinates of the respective bonding points previously registered in step S126, the positions of the respective pads P and leads L are determined by calculation (position correction) from the positions of the first alignment point A1 and second alignment point A2 in the new semiconductor device 14. This is done so that the relative positions with respect to the first alignment point A1 and second alignment point A2 are preserved, and the actual bonding points are determined.

Then, bonding operations are performed on these actual bonding points (S216). More specifically, the XY table 1 is driven by the output of the control section 34, and the tool 4 is moved to the respective actual bonding points, thus performing the bonding.

As seen from the above, in the first embodiment, pattern matching between the rotated image and reference image is executed (S110), and a first alignment point A1 and second alignment point A2 constituting rotation-resistant reference points which are such that the error of the position of the comparative object detected by pattern matching between the image of a comparative object (that is obtained by imaging the comparative object disposed in an attitude that includes positional deviation in the rotational direction) and the reference image shows a minimum value are specified based upon the results of the pattern matching that is executed in step S110 (S120). Then, the positions of the image of the comparative object and the reference image are aligned using the specified first alignment point A1 and second alignment point A2 as references (S204, S210), and the position of the comparative object is calculated.

Thus, in this embodiment, the first alignment point A1 and second alignment point A2 used as rotation-resistant reference points are determined by executing pattern matching between the rotated image and reference image beforehand. Accordingly, the detection error of the position of the comparative object can be reduced when the positions of the image of the comparative object and the reference image are aligned using the first alignment point A1 and second alignment point A2 as references. As a result, even in cases where the comparative object is disposed in an attitude that includes positional deviation in the rotational direction, high-precision position detection is realized without executing pattern matching in the rotational direction which tends to require an extremely large amount of calculation.

Furthermore, in the first embodiment, the amounts of positional deviation (X1, Y1) and (X2, Y2) between the rotated image and the reference image is calculated by pattern matching of the images (S110, S116), and the first alignment point A1 and second alignment point A2 are specified as rotation-resistant reference points based upon the rotation angle Q and the amounts of positional deviation (X1, Y1) and (X2, Y2) (S120). In other words, the first alignment point A1 and second alignment point A2 are specified using the amounts of positional deviation (X1, Y1) and (X2, Y2), which are obtained by pattern matching between the rotated image and the reference image, and the rotation angle Q, which is a known quantity.

Furthermore, in the above embodiment, the positions of the respective bonding points as working processing points in the comparative object are calculated using the first alignment point A1 and second alignment point A2 as references. Accordingly, since the positions of the first alignment point A1 and second alignment point A2 are determined with a high degree of precision, the detection of the positions of the respective bonding points can also be accomplished with a high degree of precision.

Figure 11:
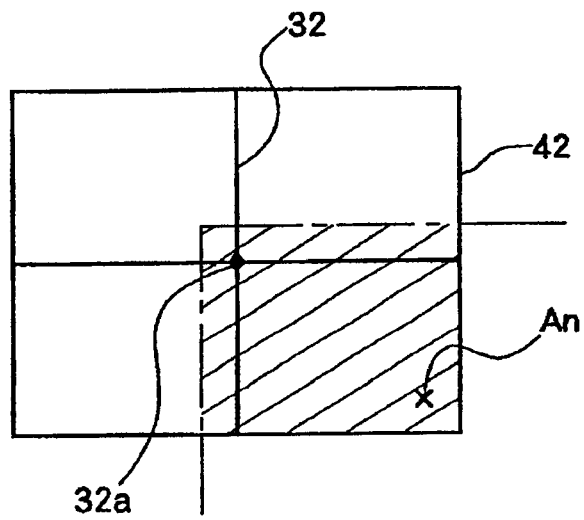
FIG. 11 is an explanatory diagram that illustrates the relationship between the position of the camera at the time of acquisition of the image of the comparative object and the effective region of the reference image in the first embodiment of the present invention.

Moreover, in the above embodiment, when a new semiconductor device 14 is imaged in the run time processing, the camera 7 is positioned at the imaging points used at the time of registration of the respective alignment points instead of being positioned at the first alignment point A1 or second alignment point A2 (S202, S208). The reason for this is as follows: in cases where an alignment point An is located within the reticle mark 42 near the periphery of the reticle mark 42 when a region surrounded by the reticle mark 42 is used as a reference image as shown in FIG. 11, assuming that the center point of the visual field of the camera 7 is positioned at the alignment point An in steps S202 and S208, the reference image that can be effectively utilized in this case is limited to the superimposed portions (i.e., the region indicated by hatching in FIG. 11) of the visual field in this attitude (the region indicated by a one-dot chain line in FIG. 11) and the reference image, so that the region that can be effectively utilized as a reference image is reduced in size. However, it is possible to realize a considerable degree of detection precision excluding this inconvenience; accordingly, a structure in which the center point of the visual field of the camera 7 is positioned at the alignment point An in steps S202 and S208 can be used; and such a structure is also in the scope of the present invention.

Figure 12:
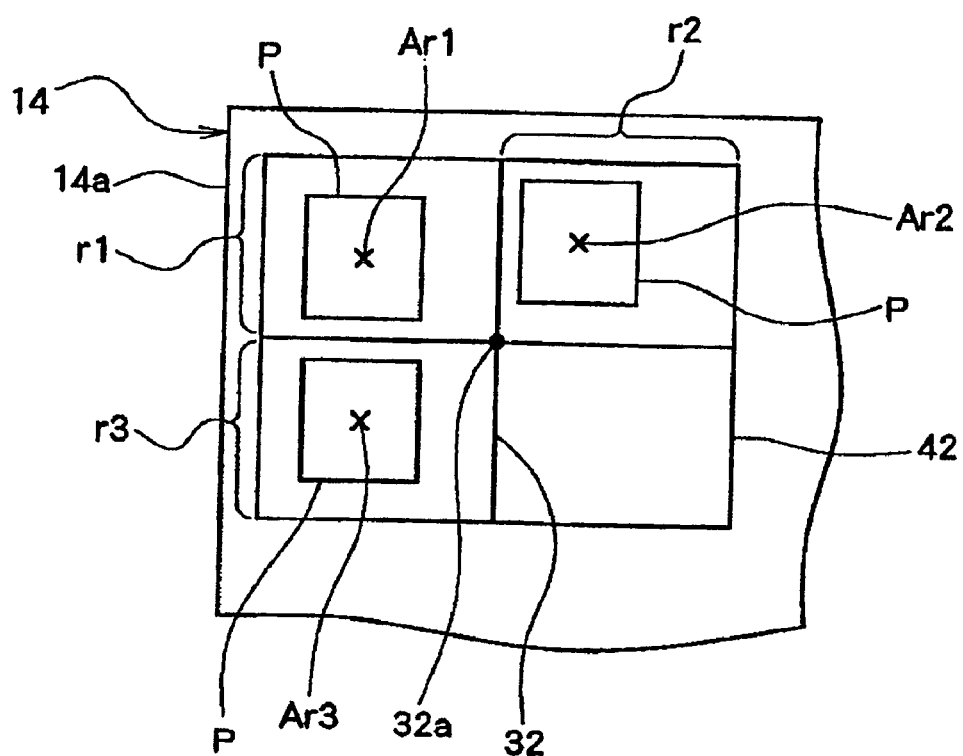
FIG. 12 is an explanatory diagram that illustrates a modification of the first embodiment of the present invention.

Furthermore, in the above embodiment, the region surrounded by the rectangular reticle mark 42 within the reference image is used as a template image, and the number of template images within the reference image is set at one (1). However, instead of such a structure, it is also possible to use a structure in which template images are prepared for a plurality of portions in a single reference image, and a plurality of template images are used. For example, as seen from FIG. 12, among a total of four regions partitioned vertically and horizontally by the cross marks 32 and reticle mark 42, the three regions in which marked pads P are contained are respectively designated as small reference images r1, r2 and r3. Then, in a suitable operation, the center points Ar1 through Ar3 are determined as rotation-resistant reference points in the respective pads P by processing similar to that of steps S108 through S120 in the first embodiment; and in the run time processing, the amounts of positional deviation of the center points Ar1 through Ar3 in the new semiconductor device 14 are respectively calculated. In such a case, it is clear that the detection precision is improved compared to the case in which a single template image is used for a single reference image. Such a structure is also in the scope of the present invention.

Furthermore, in the above-described embodiment, the coordinates of the positions of the alignment points are calculated using Numerical Expressions 2 and 3, which are approximate equations. Instead, it is also possible that the alignment points are determined by numerical equations other than the equations of Numerical Expressions 2 and 3. Furthermore, it is also possible to use a structure in which a table that indicates the relationship of the coordinates (X1, Y1) and (X2, Y2) of the points of maximum coincidence, the rotational angle Q (degrees) and the coordinates of the positions of the alignment points is prepared beforehand, and the coordinates of the positions of the alignment points are read out from this table based upon the input coordinates (X1, Y1) and (X2, Y2) of the points of maximum coincidence and rotational angle Q (degrees).

Second Embodiment

Next, the second embodiment of the present invention will be described.

In this second embodiment, as in the first embodiment, the first alignment point A1 and second alignment point A2 which are rotation-resistant reference points are specified based upon pattern matching between a rotated image obtained by rotating a reference image and this reference image. However, the feature of the second embodiment is that the amount of coincidence between the rotated image and the reference image is respectively calculated for a plurality of different centers of rotation within the reference image, and centers of rotation that show a relatively large amount of coincidence among the plurality of different centers of rotation are specified as rotation-resistant reference points. The mechanical structure in the second embodiments described below is the same as that in the first embodiment, and a detailed description thereof is omitted.

Figure 13:
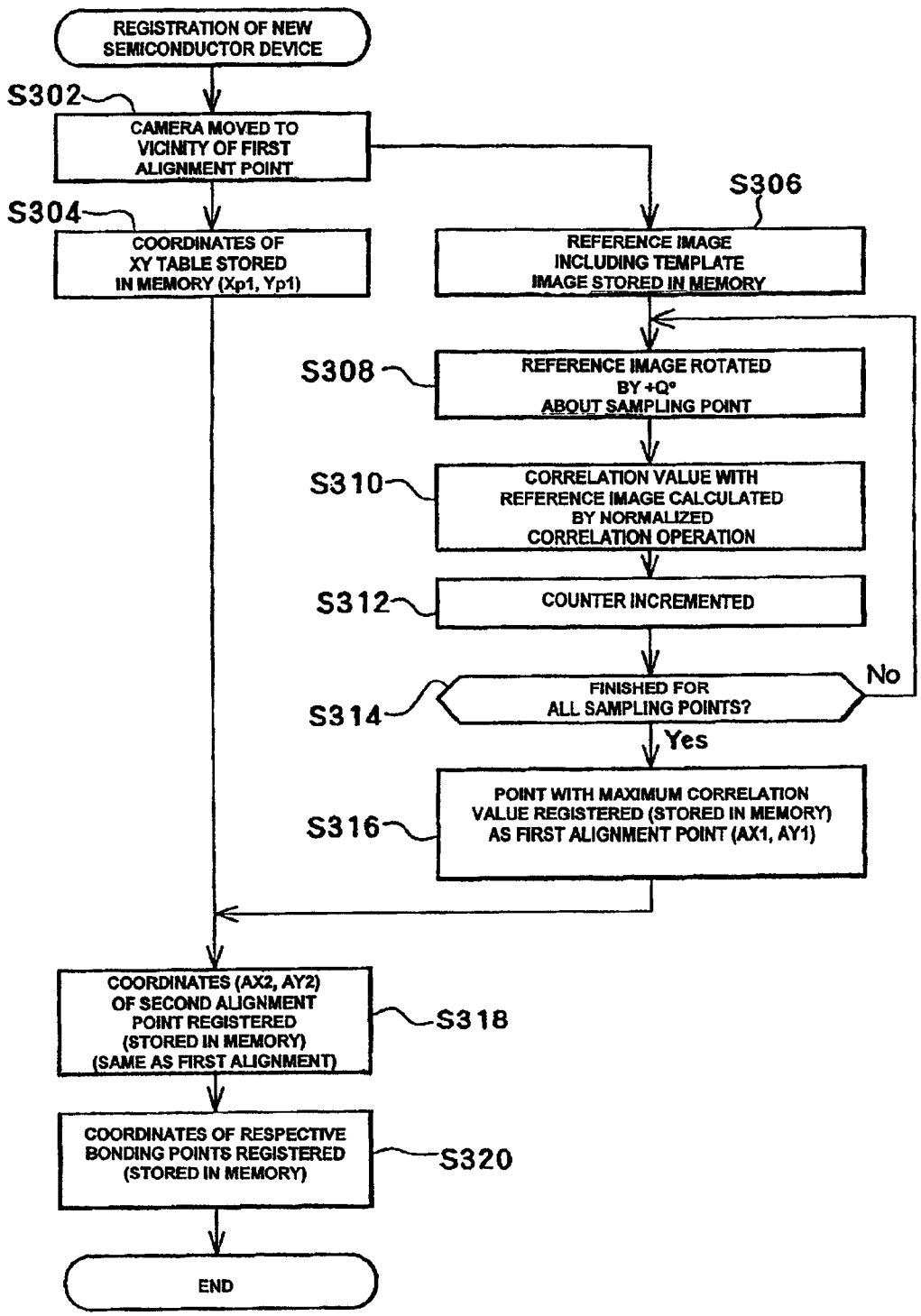
FIG. 13 is a flow chart of one example of the registration processing of a new semiconductor device according to the second embodiment of the present invention.

The operation of the second embodiment will be described with reference to the flow chart of FIG. 13.

The XY table 1 is driven by the output of the control section 34 so that the camera 7 is moved to the vicinity of the point that is to be the first alignment point (S302). The position of the center point of the cross marks 32 in the moved attitude is stored in the data memory 36 by the output of the control section 34 as the coordinates (Xp1, Yp1) of the reference imaging point (S304). The semiconductor device 14 is imaged by the camera 7 in this position. The image data converted into an electrical signal is processed by the image processing section 38 and stored in the data memory 36 as a reference image (S306). The region surrounded by the rectangular reticle mark 42 within the reference image is used as a template image in the position detection process (described later). The above processing is the same as the processing in steps S102 through S106 of the first embodiment.

Next, in the calculation processing section 37, processing is performed so as to rotate the reference image by +Q° (degrees) (S308). This rotation is performed for each of the sampling points constituting the plurality of different centers of rotation within the reference image. For example, the sampling points are set as four rows and six columns of sampling points Sp11 through Sp46 in FIG. 14.

Next, a pattern matching processing between the rotated image and the reference image is executed. In other words, the correlation value of the rotated image, which is obtained as a result of performing rotation processing on the first sampling point Sp11, and the reference image, is calculated using a normalized correlation operation that is the same as that of the Numerical Expression 1 (S310).

These steps S308 and S310 are repeated until correlation values are calculated for all of the sampling points Sp11 through Sp46 within the reference image (S312 and S314).

Then, the point showing the maximum calculated correlation value among all of the sampling points Sp11 through Sp46 is selected as the first alignment point A1, and the coordinates (AX1, AY1) of this point are registered (stored) in the data memory 36 (S316).

Figure 14:
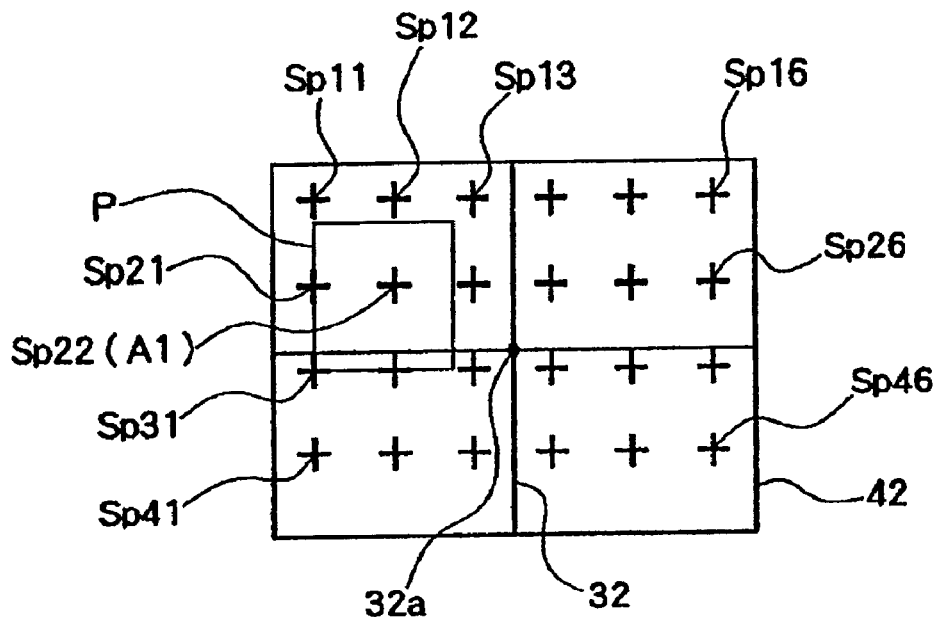
FIG. 14 is an explanatory diagram that illustrates the setting of the sampling points in the second embodiment.

Here, in the example shown in FIG. 14, of all of the sampling points Sp11 through Sp46, the sampling point Sp22 shows the largest correlation value. Therefore, the sampling point Sp22 is registered as the first alignment point A1.

Next, a processing similar to that of steps S302 through S316 is performed for the second alignment point (S318), and the coordinates (AX2, AY2) of the second alignment point thus determined are stored in the data memory 36. Furthermore, the second alignment point A2 is not shown in the drawings.

Next, the coordinates of the respective bonding points are registered (S320). As in the case of the first embodiment, this registration of the coordinates of the respective bonding points is accomplished as follows: for example, in the case of the individual pads P and leads L other than the pads P selected as the first alignment point A1 and second alignment point A2, the visual field is moved to an appropriate position on the pad or lead, typically a point located at the approximate center of each pad P or lead L, and the coordinates of each bonding point are stored in the data memory 36 by, for instance, pressing the input switch of the manual input means 33, while aligning the center point 32a of the cross marks 32 with this bonding point. The above processing is performed when a new semiconductor device 14 is registered.

The subsequent run time processing is the same as that in the first embodiment (FIG. 3).

Thus, in the second embodiment, correlation values representing the amount of coincidence between the rotated image and the reference image are respectively calculated for each of the sampling points Sp11 through Sp46, which constitute a plurality of different centers of rotation within the reference image, and the sampling point Sp22 which shows the largest correlation value of any of the sampling points Sp11 through Sp46 is specified as the first alignment point A1, which is a rotation-resistant reference point. Accordingly, the influence of the positional deviation of the attitude of the comparative object in the rotational direction can be reduced.

Furthermore, in the second embodiment, the sampling point Sp22 which shows the largest correlation value of any of the sampling points Sp11 through Sp46 is selected as the first alignment point A1. However, a considerable degree of precision in position detection can also be realized by using a structure in which a point in the vicinity of the sampling point Sp22 is selected as the first alignment point instead of a structure in which the sampling point Sp22 itself is designates as the first alignment point A1. For example, it is possible to use a structure in which a plurality of sampling points with high correlation values (e.g., a specified number of sampling points, or all sampling points included in a specified range of values) are selected from the top, and the mean value of the position coordinates of these sampling points are designated as the alignment point; or the position coordinates of the point at which the correlation value shows a maximum value is estimated by calculation based upon the position coordinates of the selected plurality of sampling points, and this point is designated as the alignment point.

Figure 15:
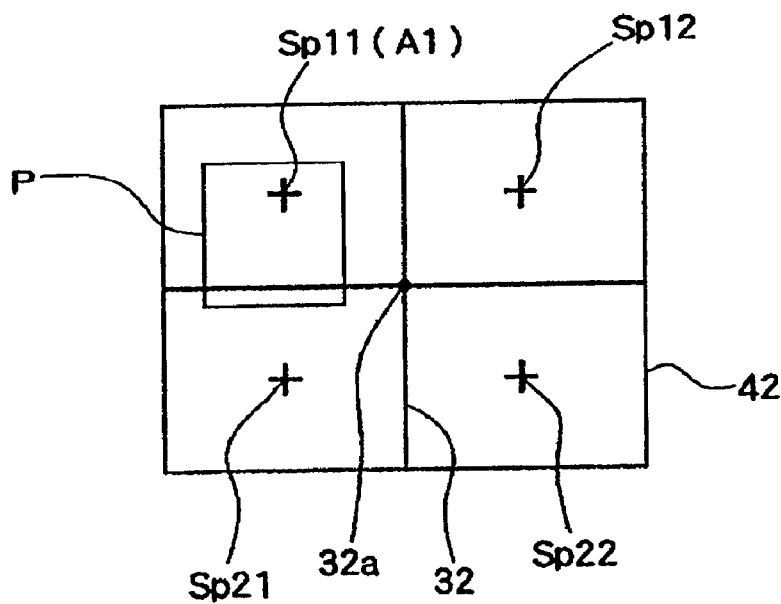
FIG. 15 is an explanatory diagram that illustrates the setting of the sampling points in a modification of the second embodiment of the present invention.

Also, in the second embodiment, the detection precision increases as the number of sampling points increases. However, as long as there are two or more sampling points within the reference image, the detection precision increases compared to a structure in which the coordinates of the position of the center point 32a of the cross marks 32 within the reference image are unconditionally taken as the alignment point as in a conventional method. For example, as shown in FIG. 15, a structure can bed used in which the region surrounded by the reticle mark 42 that is to form the reference image is divided into two equal parts in both the vertical and horizontal directions, and the center points of a total of four split regions are respectively designated as the sampling points Sp11 through Sp22. In this case, it is advisable to designate the sampling point that has the largest correlation value of any of the sampling points Sp11 through Sp22 (in the example shown in FIG. 15, this is the sampling point Sp11) as the alignment point A1. In such a structure, the detection precision deteriorates compared to a case in which numerous sampling points are disposed as shown in FIG. 14. However, the detection precision is still higher compared to the structure in which the coordinates of the position of the center point of the cross marks 32 within the reference image are unconditionally set as the alignment point as in conventional methods.

It is not essential that the position coordinates of the sampling point be designated "as is" as the alignment point. For example, it is also possible to use a structure in which: the vertices at the four corners of the reticle mark 42 in FIG. 15 are used as sampling points whose respective correlation values are determined, the region surrounded by the reticle mark 42 is divided into two equal parts in the vertical and horizontal directions, the center points of a total of four split regions thus obtained are designated as alignment point candidates, and the center point of the quarter-region containing the sampling point with the largest correlation value is selected as the alignment point.

Third Embodiment

Next, the third embodiment of the present invention will be described.

In this third embodiment, at least two alignment points are specified for a single comparative object; and in the alignment of the positions of the comparative object and reference image, the above-described two or more alignment points are contained in a single image frame. The mechanical structure of the third embodiment is the same as that of the first embodiment; accordingly, a detailed description thereof is omitted.

Figure 16:
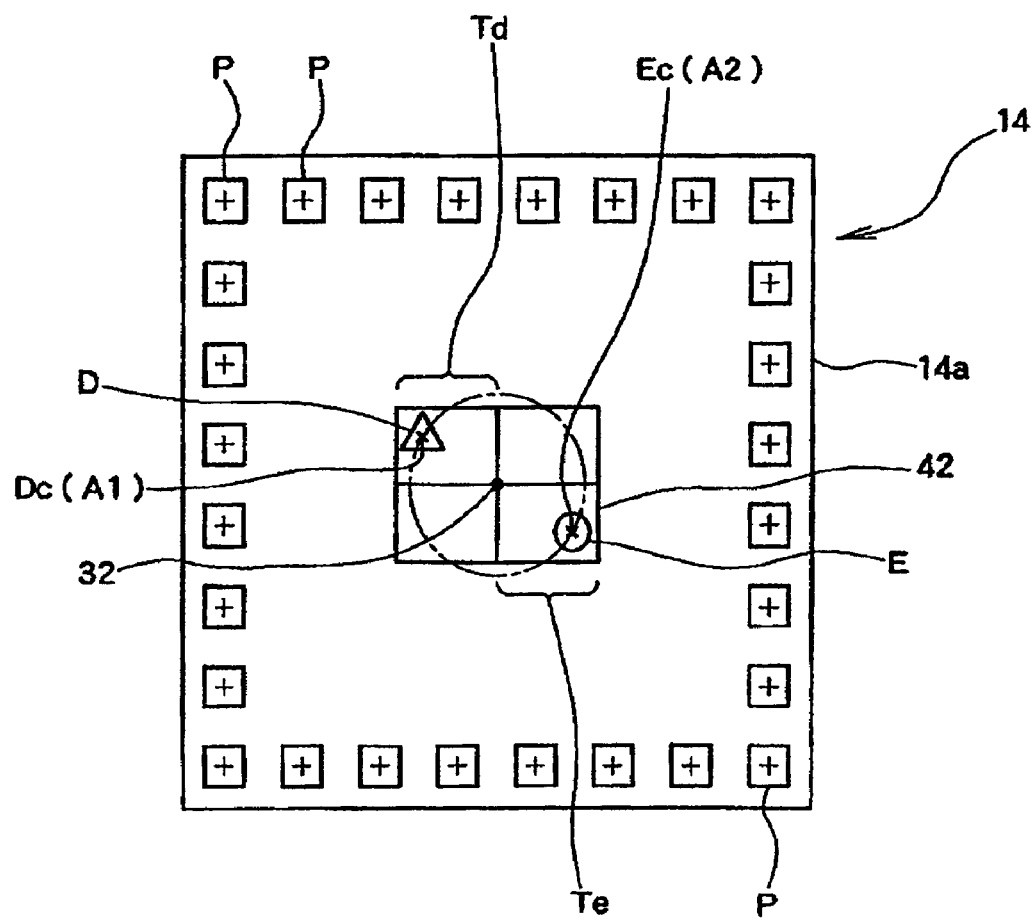
FIG. 16 is a plan view of the semiconductor device used in the third embodiment of the present invention of the present invention.

In the third embodiment, as seen from FIG. 16, a semiconductor device 14 is used which has two reference patterns D and E in a region located on the inside of the semiconductor chip 14a with respect to the positions of the pads P. In this addition, the respective center points Dc and Ec in these reference patterns D and E are respectively used as the first alignment point A1 and second alignment point A2. Furthermore, the respective center points of the pads P constitute the bonding points. In other words, the bonding points are present as working processing points on the outside of a circle, which contacts the center points Dc and Ec of the two reference patterns D and E (i.e., the alignment points A1 and A2) and whose diameter is a straight line connecting both of these center points.

Next, the operation of the third embodiment will be described.

Figure 17:
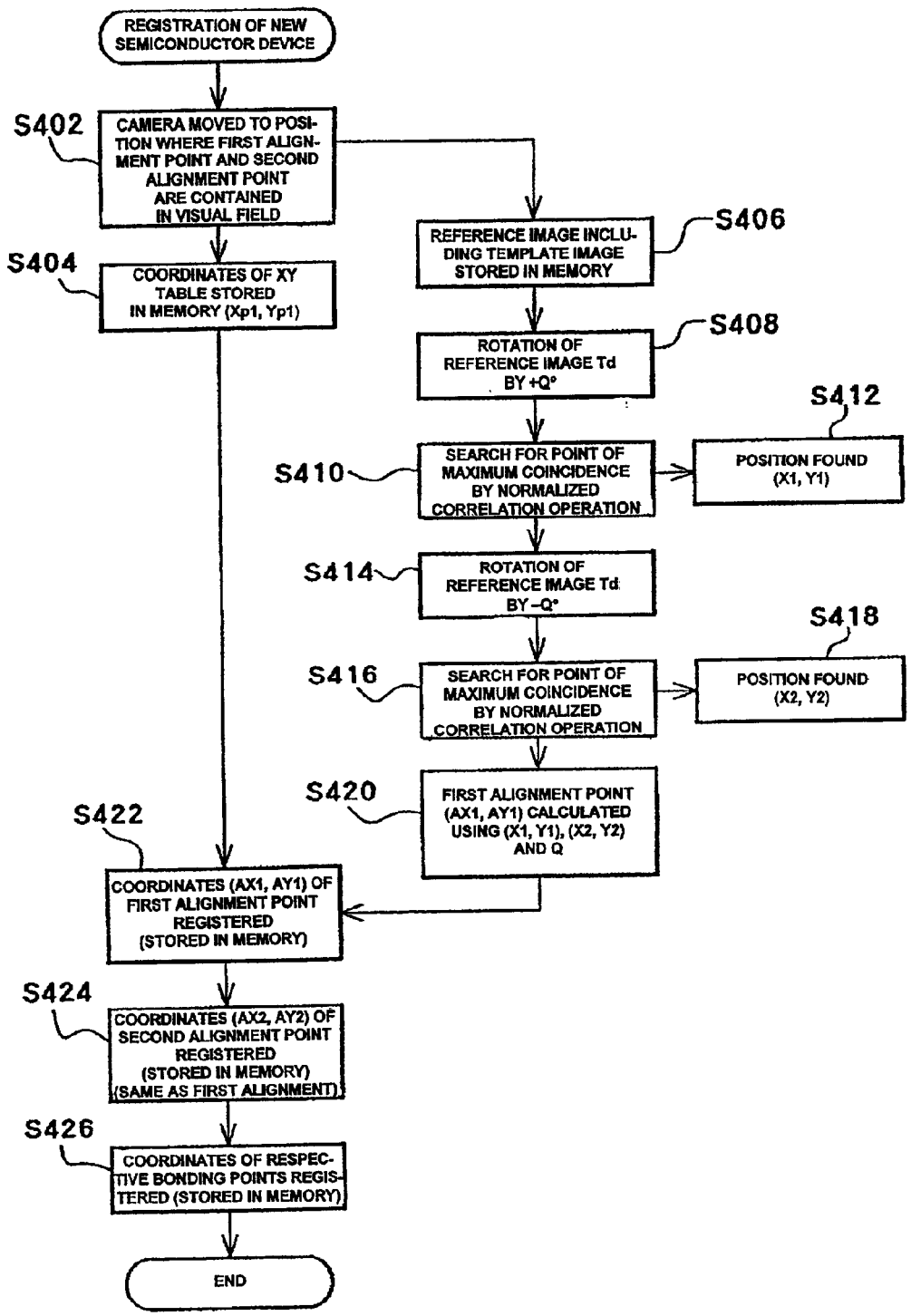
FIG. 17 is a flow chart of one example of the registration processing of a new semiconductor device according to the third embodiment of the present invention.
Figure 18:
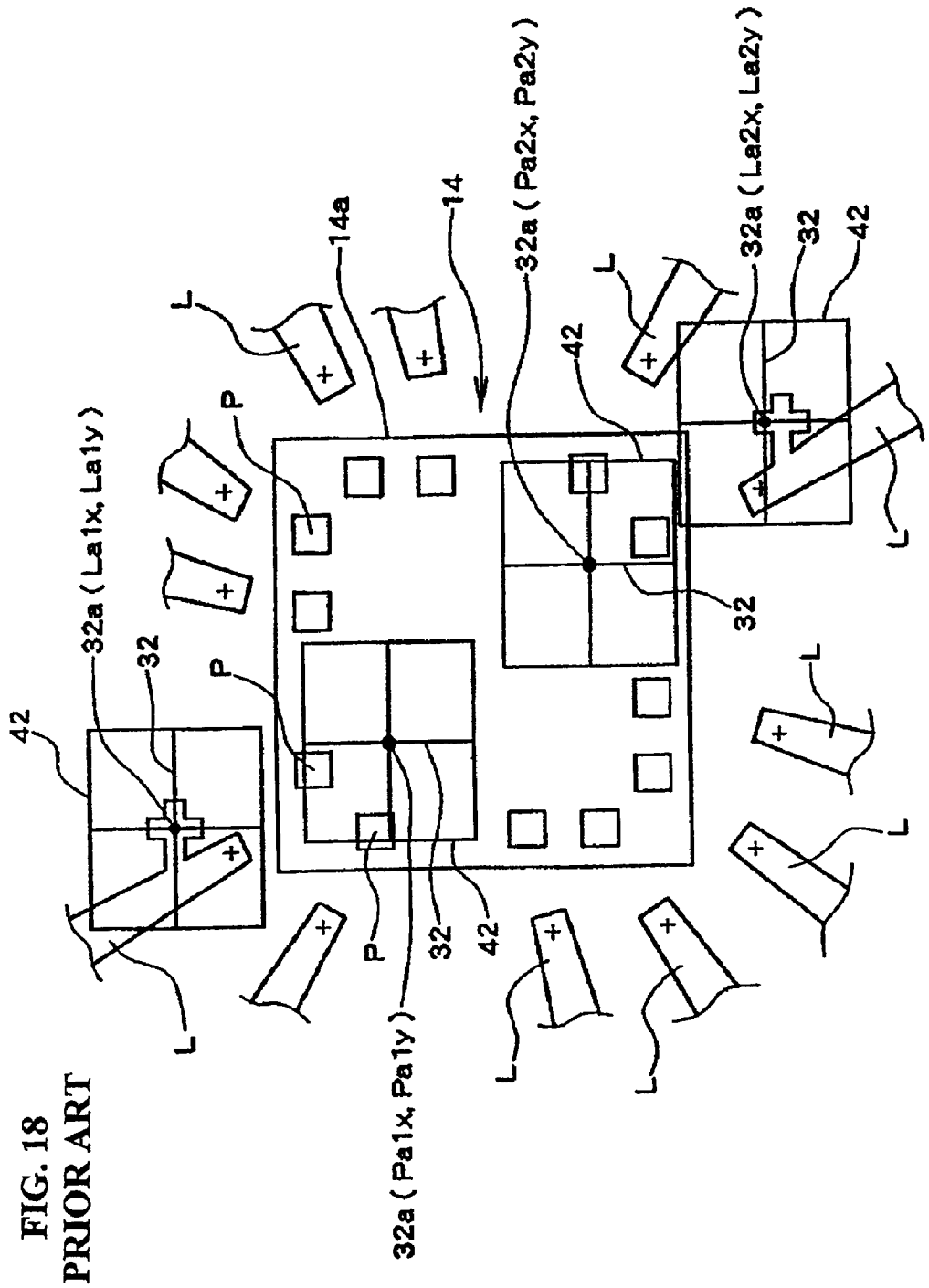
FIG. 18 is an explanatory diagram that illustrates the alignment point setting process in prior art.
Figure 19:
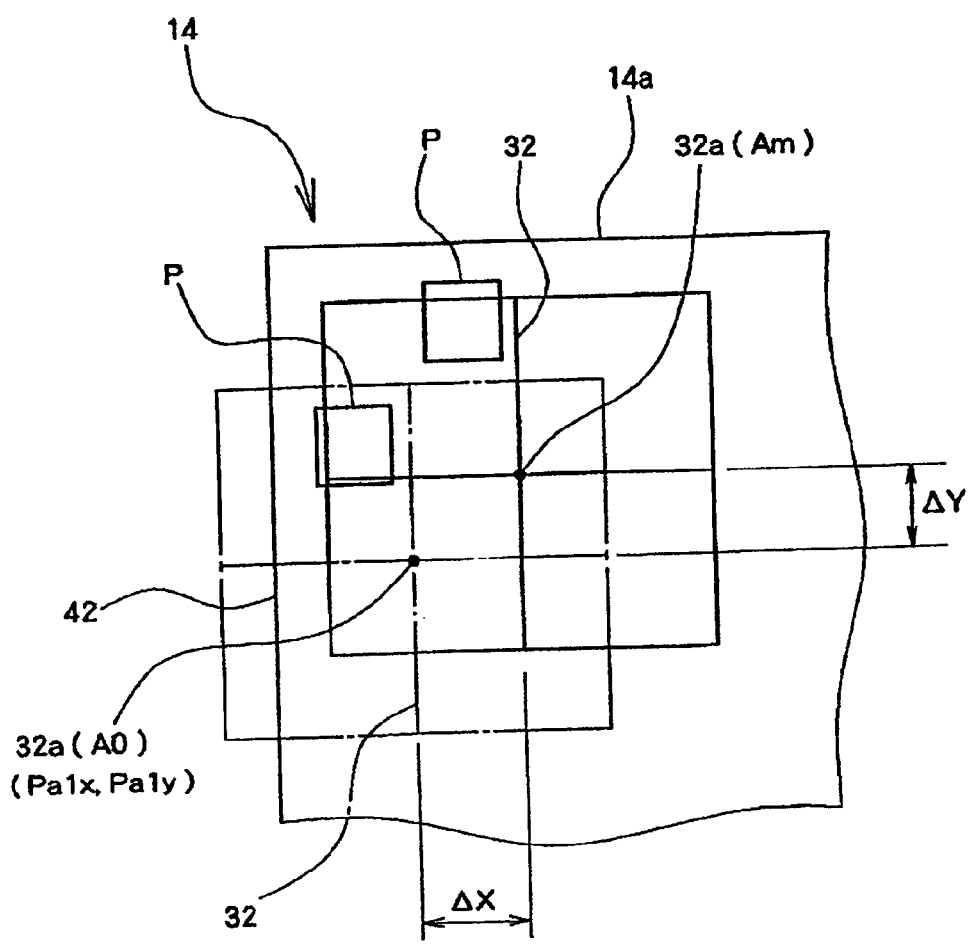
FIG. 19 is an explanatory diagram that illustrates the process of pattern matching between the image of the comparative object and the reference image in prior art.
Figure 20:
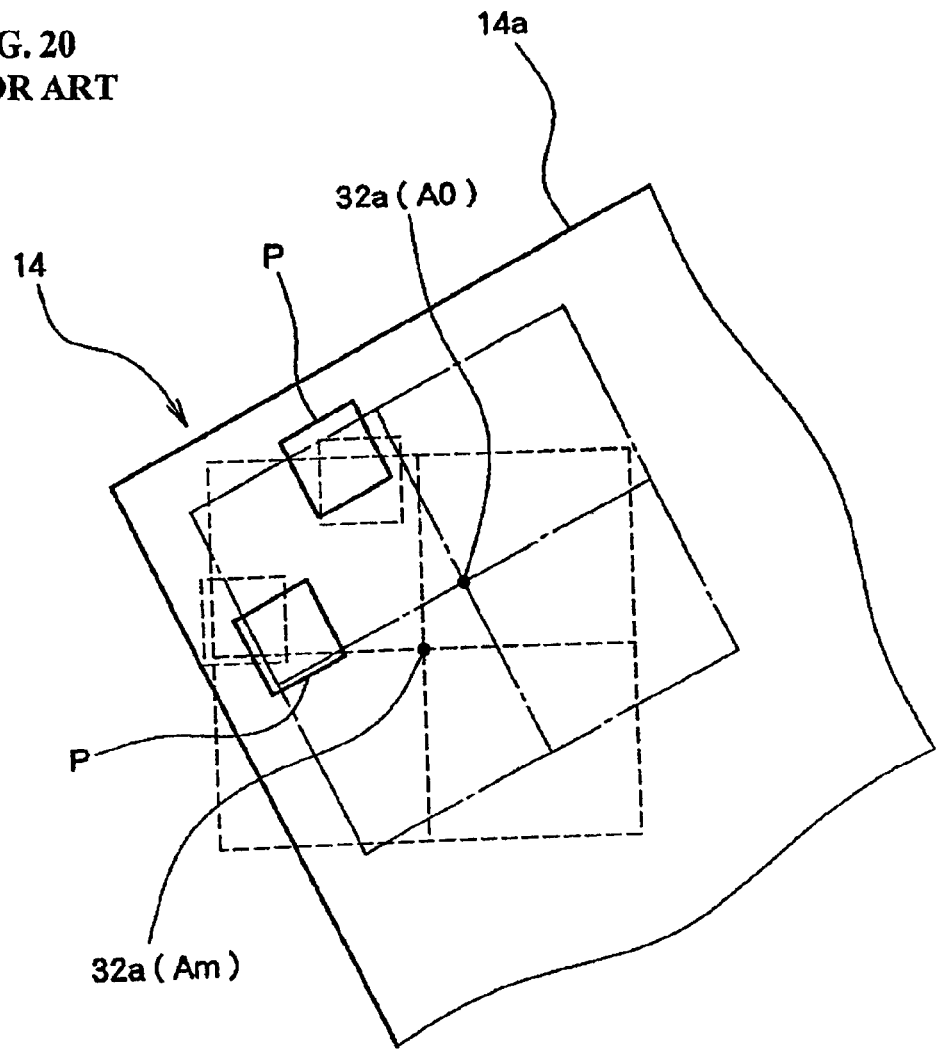
FIG. 20 is an explanatory diagram that shows the causes of position detection error in prior art.

In FIG. 17, the XY table 1 is first driven by the output of the control section 34 so that the camera 7 is moved to a position where the points that are to be the first alignment point and second alignment point (i.e., the center points Dc and Ec) are included in the visual field of the camera 7. In other words, the camera 7 is moved to a position where the reference patterns D and E are surrounded by the reticle mark 42 (S402). The position of the center point of the cross marks 32 in the moved attitude is stored in the data memory 36 by the output of the control section 34 as the coordinates (Xp1, Yp1) of the reference imaging point (S404). In this position, the semiconductor device 14 is imaged by the camera 7; and the image data converted into an electrical signal is processed by the image processing section 38 and stored in the data memory 36 as a reference image (S406).

Here, in the reference image thus acquired, the region surrounded by the rectangular reticle mark 42 is divided into two equal parts in the vertical and horizontal directions by the cross marks 32. Among the total of four split regions, the two marked regions containing the reference patterns D and E are respectively designated as small reference images Td and Te.

Then, the center points Dc and Ec are determined as rotation-resistant reference points in the respective reference patterns D and E by the same processing as that performed in steps S108 through S126 in the first embodiment (S408 through S426). However, since the image of the reference pattern E containing the center point Ec that is to be the second alignment point has already been acquired previously at the time of imaging in step S406, imaging of the reference pattern E is not performed again in step S424. In other words, images for both of the reference patterns D and E are obtained by a single imaging of the semiconductor device 14.

In the run time processing, a processing similar to that of the first embodiment (FIG. 3) is performed. More specifically, the amounts of positional deviation of the center points Dc and Ec in the new semiconductor device 14 are respectively calculated, the position coordinates of the center points of the respective pads P constituting the respective bonding points are subjected to position correction, and then bonding is performed.

As seen from the above, in the third embodiment, the respective center points Dc and Ec of the reference patterns D and E (i.e., the alignment points A1 and A2), which constitute two rotation-resistant reference points, are specified for a semiconductor device 14 which constitutes a single comparative object. In addition, in the alignment of the positions of the comparative object and the reference image, the respective center points Dc and Ec of the reference patterns D and E are included within the region surrounded by the reticle mark 42 in the visual field of the camera 7, which is a single image frame. Accordingly, there is no need to perform image acquisition separately for the respective reference patterns D and E, and an image acquisition at the time of position alignment needs to be performed only once (S406). Thus, the working efficiency of the position detection process can be improved.

Furthermore, in the third embodiment, the respective center points Dc and Ec of the reference patterns D and E (i.e., the alignment points A1 and A2), which constitute two rotation-resistance reference points, are specified for the semiconductor device 14, which is a single comparative object. Moreover, bonding points that are present on the outside of a circle (indicated by a one-dot chain line in FIG. 16), which contacts the respective center points Dc and Ec of these reference patterns D and E and whose diameter is a straight line connecting both of these center points, are calculated. Accordingly, the distance of the relative movement of the camera 7 and the semiconductor device 14 during the imaging of the reference patterns D and E can be reduced compared to the movement in the structure in which bonding points that are present inside a region surrounded by the two alignment points are calculated as in conventional methods. In particular, in the third embodiment, since the reference patterns D and E are contained within the reticle mark 42 in the visual field of the camera 7 which is a single image frame, the distance of the relative movement of the camera 7 and the semiconductor device 14 during the imaging of the reference patterns D and E can be reduced to zero. Accordingly, the working efficiency of the position detection process is improved, and this embodiment is especially suitable for bonding performed on large semiconductor devices.

In embodiments described above, correlation values are used as indicators for evaluating the amount of coincidence between the reference image and the rotated image or the amount of coincidence between the reference image and the input image. However, such a structure is merely an example. The amount of coincidence in the present invention can also be evaluated using various other universally known methods for evaluating coincidence. For instance, a method that uses residual differences can be employed. Furthermore, in cases where the amount of coincidence between binary images is evaluated, a count value obtained by a method in which pixels whose values agree are counted as one (1) and pixels whose values do not agree are counted as zero, can be used as the amount of coincidence.

Furthermore, in the above embodiments, alignment points are calculated utilizing the pads P and reference patterns D and E. However, it is not essential that the alignment points be determined utilizing such pads P or reference patterns D and E. As long as the patterns used have a detectable unique shape that appears in the semiconductor device 14, then, other patterns, especially the shapes of portions of the semiconductor chip 14a, unique sequences of a plurality of patterns, or combinations of such, can be utilized.

In addition, in the respective embodiments described above, descriptions are made with reference to the process in which mainly bonding points on the pads P are calculated. However, it goes without saying that such a process can be performed in the calculation of bonding points on the leads L or other members.

Furthermore, in the shown embodiments, the invention is described with reference to a wire bonding apparatus. However, the present invention is widely used for position detection in other types of semiconductor manufacturing apparatuses and apparatuses of other types that uses pattern matching. Such structures are also in the scope of the present invention.

What is claimed is:

1. An image processing method comprising the steps of:
   executing pattern matching between a rotated image and a reference image, said rotated image being obtained by rotating said reference image that is inputted beforehand,
   specifying, based upon a result of said pattern matching, a rotation-resistant reference point at which an error of position of a comparative object becomes a minimum value, said error being detected by pattern matching between an image of said comparative object, which is obtained by imaging said comparative object disposed in an attitude that includes a positional deviation in a direction of rotation, and said reference image, and
   performing a positional alignment of said image of said comparative object and said reference image using said rotation-resistant reference point as a reference, thus calculating a position of said comparative object.

2. An image processing method comprising the steps of
   calculating an amount of positional deviation between a rotated image and a reference image based upon pattern matching between said rotated image and said reference image, said rotated image being obtained by rotating said reference image that is inputted beforehand,
   specifying, based upon an angle of said rotation and said amount of positional deviation, a rotation-resistant reference point at which an error of position of a comparative object becomes a minimum value, said error being detected by pattern matching between an image of said comparative object, which is obtained by imaging said comparative object disposed in an attitude that includes a positional deviation in a direction of rotation, and said reference image, and
   performing a positional alignment of said image of said comparative object and said reference image using said rotation-resistant reference point as a reference, thus calculating a position of said comparative object.

3. An image processing method comprising the steps of:

performing calculations of amount of coincidence between a rotated image and a reference image for each of a plurality of different centers of rotation within said reference image, said rotated image being obtained by rotating said reference image that is inputted beforehand, specifying a center of rotation or a point in a region near said center of rotation as a rotation-resistant reference point, said center of rotation being within a specified range from a maximum value of said amount of coincidence among said plurality of different centers of rotation, and said rotation-resistant reference point being at which an error of position of a comparative object becomes a minimum value, said error being detected by pattern matching between an image of said comparative object, which is obtained by imaging said comparative object disposed in an attitude that includes a positional deviation in a direction of rotation, and said reference image, and performing a positional alignment of said image of said comparative object and said reference image using said rotation-resistant reference point as a reference, thus calculating a position of said comparative object.

4. The image processing method according to claim 1, 2 or 3, wherein:

at least two of said rotation-resistant reference points are specified for a single comparative object, and said at least two of rotation-resistant reference points are included in a single image frame upon performing said positional alignment.

5. The image processing method according to claim 1, 2 or 3, said method further comprising the step of calculating working processing points in said comparative object using said rotation-resistant reference points as a reference.

6. The image processing method according to claim 4, said method further comprising the step of calculating working processing points in said comparative object using said rotation-resistant reference points as a reference.

7. The image processing method according to claim 5, wherein:

two of said rotation-resistant reference points are specified for a single comparative object, and working processing points that are present outside a circle, which contacts said two rotation-resistant reference points and whose diameter is a straight line that connects said two rotation-resistant reference points, are calculated.

8. The image processing method according to claim 6, wherein:

two of said rotation-resistant reference points are specified for a single comparative object, and working processing points that are present outside a circle, which contacts said two rotation-resistant reference points and whose diameter is a straight line that connects said two rotation-resistant reference points, are calculated.

9. An image processing device comprising:

a trial processing means that executes pattern matching between a rotated image and a reference image, said rotated image being obtained by rotating said reference image that is inputted beforehand, a reference point calculating means that specifies, based upon a result of said pattern matching, a rotation-resistant reference point at which an error of position of a comparative object becomes a minimum value, said error being detected by pattern matching between an image of said comparative object, which is obtained by imaging said comparative object disposed in an attitude that includes a positional deviation in a direction of rotation, and said reference image, and a position detection means that performs a positional alignment of said image of said comparative object and said reference image using said rotation-resistant reference point as a reference, thus calculating a position of said comparative object.

* * * * *